United States Patent [19]

Brown et al.

[11] Patent Number: 4,523,067
[45] Date of Patent: Jun. 11, 1985

[54] TEMPERATURE GRADIENT ZONE MELTING APPARATUS

[75] Inventors: Roger H. Brown, Burbank; Kuen Chow, Thousand Oaks; Norman W. Goodwin, Encino; Jan Grinberg, Los Angeles, all of Calif.

[73] Assignee: Hughes Aircraft Company, El Segundo, Calif.

[21] Appl. No.: 366,901

[22] Filed: Apr. 9, 1982

[51] Int. Cl.³ .............................................. H05B 6/10
[52] U.S. Cl. ........................... 219/10.49 R; 219/10.67; 148/1.5; 118/624
[58] Field of Search ...................... 219/10.49 R, 10.67, 219/341; 148/1.5, 171, 172, 177, 179, 187, 188; 118/624, 59, 69; 427/88

[56] References Cited

U.S. PATENT DOCUMENTS

| | | | |
|---|---|---|---|
| 3,521,018 | 7/1970 | Boerger et al. | 219/10.49 R |
| 3,845,738 | 11/1974 | Berkman et al. | 219/10.49 R X |
| 3,895,967 | 7/1975 | Anthony et al. | 148/171 X |
| 3,897,277 | 7/1975 | Blumenfeld | 148/171 X |
| 4,001,047 | 1/1977 | Boah | 148/171 X |
| 4,035,199 | 7/1977 | Anthony et al. | 148/171 X |

Primary Examiner—Philip H. Leung
Attorney, Agent, or Firm—C. Chiang; G. B. Rosenberg; A. W. Karambelas

[57] ABSTRACT

An apparatus is provided for fabricating a semiconductor device by thermal gradient zone melting, whereby metal-rich droplets such as aluminum migrate through a semiconductor wafer such as silicon to create conductive paths. One surface of the wafer is placed directly on a heating surface to establish a high and uniform thermal gradient through the wafer. Heat in the wafer is removed from the other wafer surface. The apparatus for fabricating semiconductor devices utilizing temperature gradient zone melting comprises a base, heating means and heat sink means. Heating means comprises a platform having a generally planar heating surface adapted to receive the entire area of the one surface of at least one wafer. The heat sink means is spaced away from the other wafer surface to form a space therebetween, the space being adapted to receive a high heat conductive gas. The heat sink means and the gas cooperatively remove the heat in the wafer to enhance the establishment of the thermal gradient.

6 Claims, 8 Drawing Figures

TEMPERATURE GRADIENT ZONE MELTING APPARATUS

TECHNICAL FIELD

This invention relates to processes for fabricating semiconductor devices and, more particularly, to processes using the temperature gradient zone melting technique for fabricating three-dimensional microelectronic devices.

CROSS-REFERENCE TO RELATED APPLICATIONS

A related process employing a buffer layer is described and claimed in a related application, formerly U.S. Ser. No. 366,900, now patented as U.S. Pat. No. 4,398,974, by Kuen Chow and Jan Grinberg. The related patent discloses and claims a process comprising the step of applying a buffer layer to a wafer for efficacious fabrication of semiconductor devices. The present application and the related application now patented as U.S. Pat. No. 4,398,974, are assigned to a common assignee.

BACKGROUND OF THE INVENTION

1. Field of the Invention

Demands for ever faster transfer of signals in digital computers have led to the advent of three-dimensionally structured microelectronic semiconductor devices for use in such computers. One such three-dimensionally structured device is disclosed in U.S. Pat. No. 4,275,410, by Grinberg et al. In that device, signals are transferred through stacked semiconductor wafers each of which is interconnected with adjacent wafers by external leads extending from both surfaces of the wafer. Transfer of signals through each wafer is provided by internal connections which are positioned between the wafer surfaces. The process for fabricating such internal connections is the subject of the present invention.

2. Description of the Prior Art

One process for fabricating such internal connections is a technique generally called temperature gradient zone melting; an example of which is disclosed in U.S. Pat. No. 3,897,277, by Blumenfeld. In this process, a liquid zone migrates in a solid along a thermal gradient. In particular, a liquid droplet of metallic material placed on one surface of a solid wafer migrates through the solid and emerges on the wafer's second surface. The wafer is heated to an elevated temperature for establishing a thermal gradient through the wafer, the hotter temperature being at the second surface. The thermal gradient causes the temperature at the forward interface of the droplet to be higher than the temperature at its rear interface. Since the solubility of a solid in a liquid increases with temperature, the concentration of the atoms from the dissolved wafer solid is greater at the hotter forward interface of the liquid than at the cooler rear interface. The inequality in concentration produces a concentration gradient of atoms from the dissolved wafer solid across the liquid droplet. The concentration gradient, in turn, creates a flux of atoms from the dissolved wafer solid along this gradient, that is, a flow of atoms from the hotter front interface to the cooler rear interface. To feed this diffusion flux, additional atoms of the wafer solid are dissolved into the liquid at the forward interface and moved to the rear interface. Consequently, the liquid droplet migrates along the thermal gradient toward the hotter second surface, dissolving atoms of the wafer at its forward interface, passing the atoms toward the rear, and redepositing these atoms at its rear interface. At the cooler rear interface, the redeposited atoms recrystallize with traces of the droplet metallic material in them. Thus, the path left by the migrating liquid droplet is higher in conductivity than rest of the wafer. The conductive path, extending from one wafer surface to another, is the internal connection necessary for the operation of a three-dimensional microelectronic device. However, prior art processes employing the temperature gradient zone melting technique are deficient in several aspects.

One deficiency in the prior art is the inability of the prior art processes to produce a high thermal gradient through the wafer. Since the thermal gradient in a wafer is generally proportional to the quantity of heat that flows through the wafer and correspondingly the migration rate of the droplets is generally proportional to the thermal gradient, the quantity of heat flowing through the wafer should be as high as possible. However, both the duration that the wafer is exposed to the heat and the quantity of heat itself invariably cause defects in the wafer. Thus, creating a high thermal gradient through a wafer without using an even greater quantity of heat would result in the twin benefits of faster migration rate and less exposure to heat, producing more defect-free wafers.

One prior art process of enhancing the thermal gradient through a wafer is disclosed in U.S. Pat. No. 4,033,786, by Anthony et al., in which anti-reflection coatings are applied to wafer surfaces for trapping heat in the wafer. However, this and other prior art processes are still not efficient because each of them provides a gas-filled gap between the wafer and the heating source. The gas usually acts as an insulator in preventing the most efficacious transfer of heat from the heat source to the wafer, thereby requiring either more heat to flow through the wafer or longer exposure to heat in order to create the necessary thermal gradient. Examples of such processes are disclosed in U.S. Pat. No. 3,895,967, by Anthony et al. and U.S. Pat. No. 3,910,801, by Cline et al.

Another deficiency in the prior art is the inability of the prior art processes to provide a uniform temperature gradient through the wafer, thereby causing nonuniform droplet migration. Uniformity refers to the capability of providing both parallel heat flow lines for parallel migration of droplets and linear isotherms parallel to the wafer surfaces which indicate the establishment of the same temperature at a given depth in the wafer. Uniform droplet migration is essential in order to maximize the number of completed migrations within a certain process time limit, a completed migration being a generally vertical internal connection with exposed ends on both surfaces of the wafer. Without such uniformity, the yield of usable conductive internal connections in each wafer decreases.

The parallel heat flow line type of nonuniformity is usually caused by support pins or holders that are necessary for supporting the wafer in the heating apparatus. The pins or holders, acting like heat sinks because they are more heat conductive than the surrounding gas, create deviations in the parallel heat flow lines through the wafer. Examples of the use of such pins and holders are described in the processes disclosed in U.S. Pat. No. 3,895,967, by Anthony et al. and U.S. Pat. No.

4,001,047, by Boah. To alleviate this problem, support ribs and guard rings around the periphery of the wafer are used to prevent lateral heat flow. Such devices are used in processes disclosed in U.S. Pat. No. 3,895,967, by Anthony et al. and U.S. Pat. No. 4,035,199, by Anthony et al. respectively.

The linear isotherm type of nonuniformity occurs in infrared heating processes such as the process disclosed in T. R. Anthony and H. E. Cline, "Stresses Generated by the Thermomigation of Liquid Inclusions in Silicon," Journal of Applied Physics, Vol. 49, No. 12, December, 1978. Because silicon is semi-transparent to infrared radiation, infrared radiation is absorbed at varying depths in the wafer. The absorbed radiation, thus, provides a variety of temperatures at a given depth of the wafer, creating nonlinear isotherms through the wafer. In turn, the nonlinear isotherms created by an infrared process cause non-uniform migration of the droplets. In contrast, non-infrared processes provide the same temperature at a given depth of the wafer, thereby creating linear isotherms which are parallel to the wafer surfaces. Aluminum droplets therefore, migrate through a uniform distance of the wafer from a lower-temperatured isotherm to a higher-temperatured isotherm during the same time period.

The prior art processes, thus, are deficient in their inability to produce a high thermal gradient through the wafer and to provide a uniform temperature gradient through the wafer.

SUMMARY OF THE INVENTION

In view of the deficiencies in the prior art, it is a purpose of the present invention to provide a temperature gradient zone melting process and an apparatus capable of providing a high thermal gradient through a wafer.

It is another purpose of the present invention to provide a temperature gradient zone melting process and an apparatus capable of providing a uniform thermal gradient through a wafer.

In order to accomplish the above and further purposes, the present invention provides a novel process for fabricating a semiconductor device by thermal gradient zone melting and a novel apparatus for practicing the novel process. The process comprises the steps of first selecting a wafer body of suitable semiconductor material which is of one type of conductivity. The wafer body has two major generally parallel opposed surfaces, the opposed surfaces being respectively the top and bottom surfaces. Next, an array of droplets in solid form is deposited on the top surface, the droplets comprising suitable metal-rich conductive material which is of an opposite type of conductivity. In the art, droplets are generally referred to as such irrespective of either solid or liquid form. The wafer body is then placed on a surface of heating means, with the entire area of the bottom surface in direct physical contact with the heating surface.

The wafer body is heated to a sufficient temperature to establish a thermal gradient through the wafer body wherein the bottom surface, which is in direct contact with the heating surface, is at a higher temperature than the top surface. Simultaneously, the droplets are heated to a liquid state to enable their migration through the wafer body toward the heating surface. Moreover, heat in the wafer body is removed through its top surface in order to enhance the establishment of the thermal gradient. Thus, the droplets form column-like paths each of which has a conductivity opposite to that of the wafer body.

The apparatus for practicing the novel process comprises a base, heating means, and heat sink means. The heat means, which is mounted on the base, comprises a platform having a generally planar heating surface which is adapted to receive the entire area of the bottom surface of at least one wafer body. The heat sink means is spaced away from the top surface to form a space therebetween, the space being adapted to receive a high heat conductive gas. The heat sink means and the gas cooperatively remove heat in the wafer body from its top surface to enhance the establishment of the desired thermal gradient.

One advantage of the present invention is that a high thermal gradient is established through the wafer. Such a high gradient results from the combination of the direct placement of the wafer on the heating surface and the efficacious cooling of the wafer by the cooperative action of both the heat sink means and the heat conductive gas. With the bottom surface of the wafer in direct physical contact with the heating surface and the top surface in close proximity with the heat sink means, the desired large heat flow through the wafer is created, which in turn causes the high thermal gradient. Having the high thermal gradient and the attendant faster migration rate, either the heat flowing through the wafer may be lowered or the manufacturing time may be shortened. Either result produces more defect-free wafers.

Another advantage of the present invention is that a uniform thermal gradient is established through the wafer. The uniformity results from the direct placement of the wafer on the heating surface. The high thermal gradient enhances parallel heat flows and eliminates lateral heat flows in order to provide substantially parallel migration of droplets. In addition, the direct conduction of heat through the wafer, as contrasted to infrared heating processes, creates uniform linear isotherms, which are parallel to the wafer surfaces. This enhances uniform droplet migration.

Other purposes, features, and advantages of the present invention will appear from the following detailed description of a preferred embodiment thereof, taken together with the accompanying drawings.

DETAILED DESCRIPTION OF THE INVENTION

Figure 1:
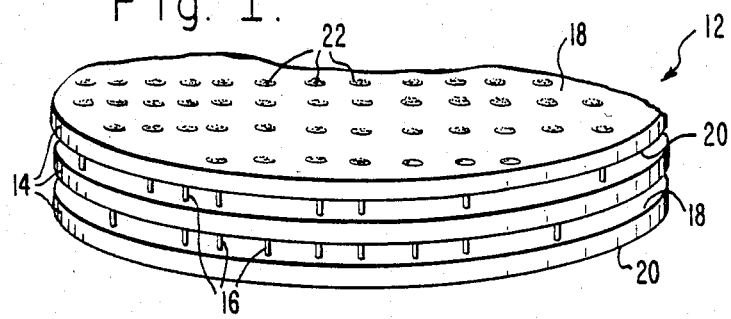
FIG. 1 is a perspective view of stacked semiconductor wafers, the process for making such wafers being the subject of the present invention.

Referring to FIG. 1, there is shown a three-dimensional microelectronic device 12 which comprises a plurality of stacked semiconductor wafers 14. As an example, three of such wafers 14 are shown. Each wafer 14 is connected to another wafer 14 by external leads 16 which may extend from either of surfaces 18, 20 of wafer 14, thereby allowing the transfer of signals from one wafer 14 to another. The transfer of signals through wafer 14 is provided by internal connections 22 which are positioned between wafer surfaces 18, 20. The process for fabricating such internal connections 22 is the subject of the present invention.

The process of the present invention employs a technique generally referred to as thermal gradient zone melting. As best illustrated in the sequence of FIGS. 4 to 7, a wafer 14 of suitable semiconductor material, which is of one type of conductivity, is selected. For example, a wafer 14 of n-type silicon is selected. Wafer 14 has a top surface 18 and a bottom surface 20. Solid droplets 24, a suitable metal-rich conductive material of an opposite type of conductivity, are placed on wafer top surface 18, as best shown by a representative single droplet 24 in FIG. 5. As an example, droplets 24 of aluminum are selected. In the art, droplets are generally referred to as droplets irrespective of either solid or liquid form. Moreover, droplets 24 may be deposited in a predetermined pattern, as depicted by FIG. 1.

Figures 4, 5, 6, 7:
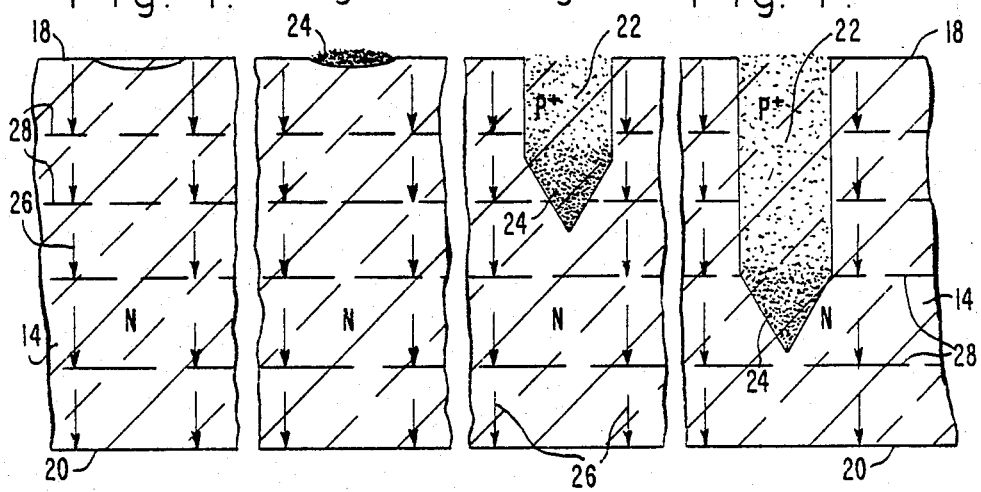
FIGS. 4 to 7 are simplified sequential cross-sectional views of the migration of one droplet through a wafer in the process of the present invention.

Wafer 14 is then heated to an elevated temperature in order to establish a thermal gradient through wafer 14, with bottom surface 20 being the hotter surface. Simultaneously, aluminum droplet 24 is heated to form a liquid which is generally referred to as a liquid zone. As shown in FIGS. 6 and 7, droplet 24 then migrates through wafer 14 toward hotter surface 20. As it migrates, droplet 24 leaves a recrystallized path which is of an opposite conductivity than the conductivity of wafer 14. The column-like path, p-type silicon in the example, eventually becomes conductive connection 22.

Figure 3:
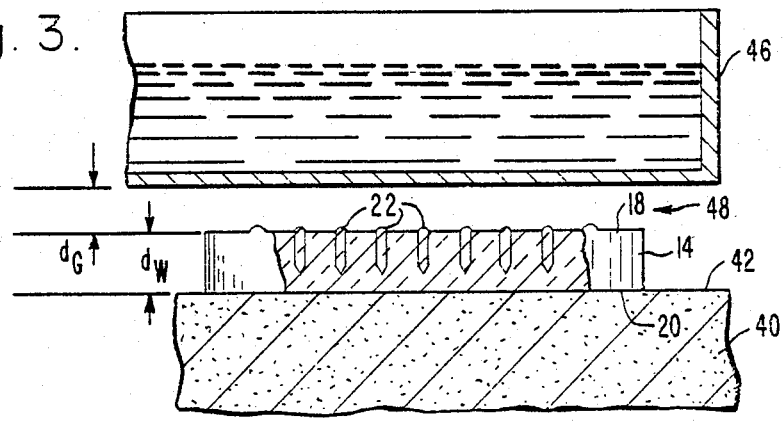
FIG. 3 is a partial enlarged view of the apparatus of FIG. 2, depicting the treatment of one partially cross-sectioned wafer.
Figure 2:
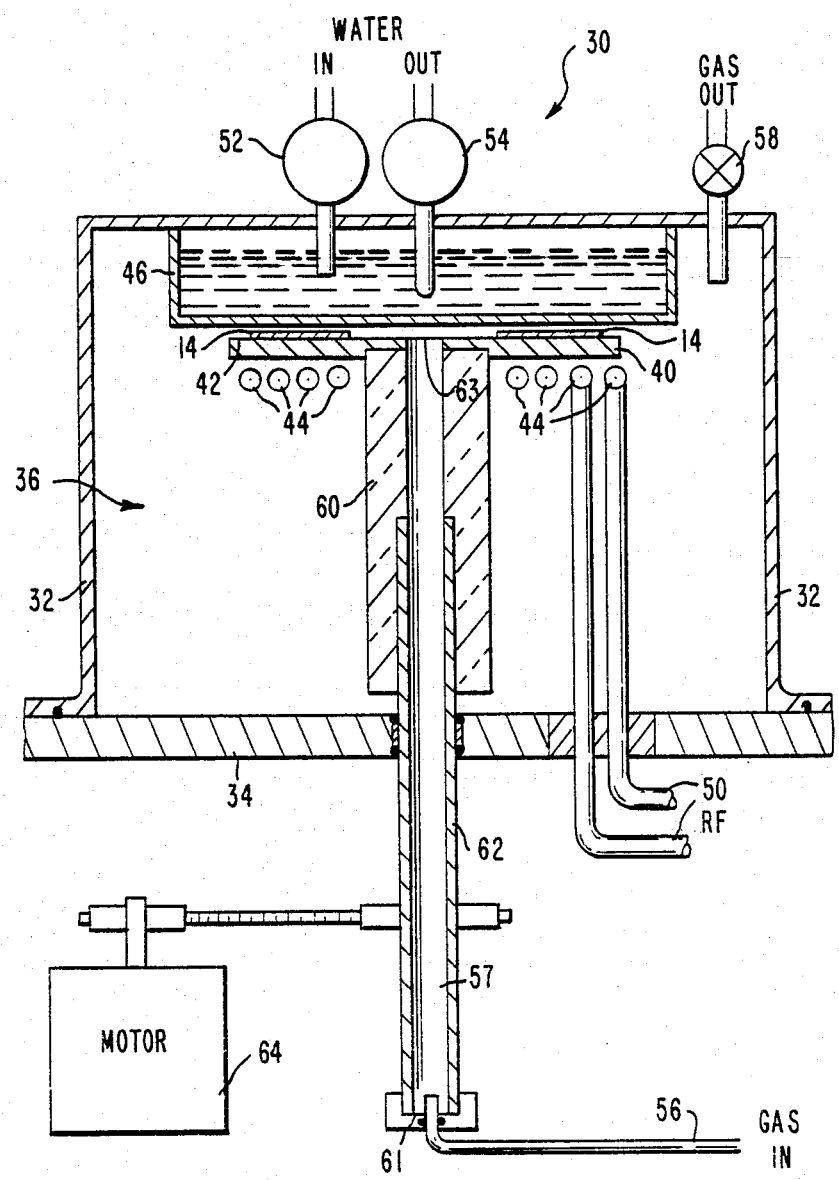
FIG. 2 is a simplified cross-sectional view of a novel apparatus useful in practicing the novel process of the present invention.
Figure 8:
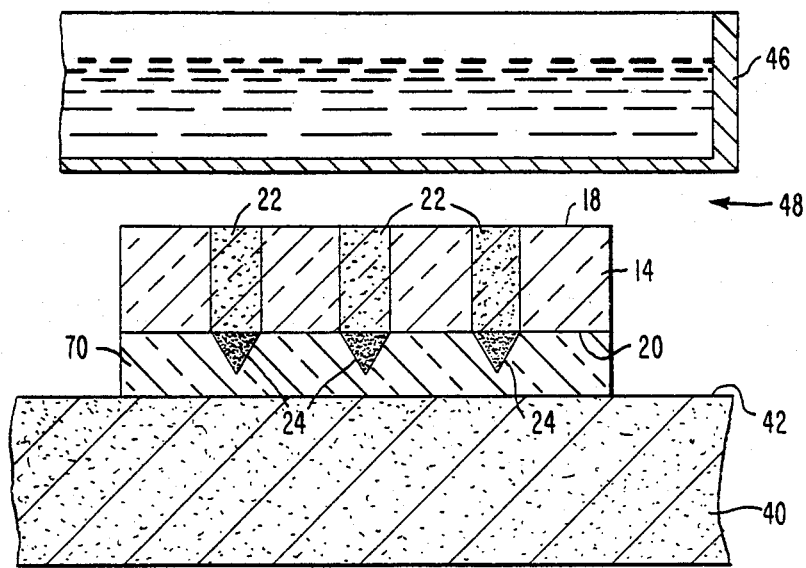
FIG. 8 is an enlarged simplified cross-sectional view of FIG. 3, with a buffer layer provided between the wafer bottom surface and the heating surface.

Referring now to FIG. 2, there is shown a novel apparatus 30 useful in practicing the novel process of the present invention. Apparatus 30 comprises removable chamber wall 32 and chamber base 34 which combine to form thermomigration chamber 36. Within chamber 36, apparatus 30 further comprises rotatable heating platform 40 which includes a generally planar heating surface 42 for supporting at least one wafer 14, two of which are shown as an example in FIG. 2. As best shown in FIG. 3, heating surface 42 is adapted to receive the entire area of wafer bottom surface 20. Platform 40 generally comprises a heat conductive material, for example, graphite. Radio-frequency coils 44 are positioned beneath heating platform 40 to induce heat therein in order to heat wafers 14. A heat sink 46, which is spaced from heating surface 42, is provided for wafers 14. In the example, heat sink 46 is a water tank. In addition, gap 48 between wafer top surface 18 and water tank 46, as best shown in FIG. 3, is provided to receive a gas of high heat conductivity such as hydrogen or helium. The gas may be in either a pure or a mixed form. In the example, helium is selected. The cooperative action of water tank 46 and the gas removes heat from wafer 14 to enhance the establishment of the desired thermal gradient through wafer 14.

Furthermore, apparatus 30 comprises radio-frequency conductors 50 which, exiting through chamber base 34, are connected to a radio frequency source, not shown. Heating platform 40 is mounted on rotatable platform drive shaft 60. Motor 64, which is connected to elevatable drive shaft 62 which in turn is connected to platform drive shaft 60, is adapted to rotate platform 40. Gas conduit 57, connected to gas entry port 56 at its external end 61, is provided within platform drive shaft 60 and drive shaft 62. Internal end 63 of gas conduit 57 is positioned adjacent heating platform 40. In addition, water entry and exit ports 52, 54, and gas entry and exit ports 56, 58 are provided.

In the preferred practice of this invention, a wafer 14 of one type of conductivity, for example, n-type silicon, is selected. Wafer 14 has two major parallel opposed top and bottom surfaces 18, 20, as best shown in FIG. 3. Wafer 14 of the preferred embodiment has a thickness, designated as $d_W$, of typically 20 mils. Next, an array of solid droplets 24 of suitable metal-rich conductive material is placed on top surface 18 of wafer 14, as best shown by the representative single droplet 24 in FIG. 5. Droplets 24 are of an opposite conductivity, for example, aluminum. This array, arranged in a typical $32 \times 32$ matrix as similar to what is shown in FIG. 1, is applied to surface 18 by conventional techniques such as direct evaporation using a shadow mask. Each droplet 24 in the preferred embodiment, for example, is approximately 3 mils in diameter and 8 to 25 micrometers in height, with a droplet center-to-droplet center distance of approximately 20 mils.

In the preferred process, two wafers 14, as an example, are placed directly on graphite heating platform 40, with the entire area of wafer bottom surface 20 in direct physical contact with heating surface 42, as best shown by the single wafer 14 in FIG. 3. Referring to FIG. 2, RF coils 44 then induce eddy currents in graphite platform 40 which, being resistive in property, transforms electrical energy into heat. Coils 44 receive RF energy through conductors 50 which in turn are connected to a RF source, not shown. Simultaneously, the heat conductive gas enters chamber 36 through entry port 56 and water enters water tank 46 through entry port 52. Gap 48, $d_G$, which is approximately 5 mils in distance in the example, is provided to receive the gas. As wafer bottom surface 20 is heated by platform 40 and as wafer top surface 18 is cooled by the cooperative action of both the gas and water tank 46, a high thermal gradient through wafer 14 is established. The gas in gap 48, being an effective heat conductive gas, removes the heat in wafer 14 from top surface 18 and transports the heat to water tank 46 for cooling.

With the entire wafer bottom surface 20 in direct physical contact with heating surface 42, a uniform thermal gradient is also established, thereby enhancing the number of completed droplet migrations. Heat in wafer 14 generally flows in a parallel fashion, as best shown by the heat flow lines 26 in FIGS. 4 to 7, for enhancing uniform droplet migration. In addition, direct heating of wafer 14 enhances the establishment of linear isotherms 28 for uniform migration of droplets 24, as best shown in FIG. 3. Linear isotherms 28 are parallel to wafer surfaces 18 and 20, as best shown in FIGS. 4 to 7. Rotation of platform 40 by motor 64 also provides a uniformity of heat at heating surface 42 for uniform heating of wafer bottom surface 20. Furthermore, for example, water of room temperature in tank 46, exiting through port 54, conveniently circulates at a rate of approximately 5-6 gallons per minute for cooling the heat conductive gas. Similarly, for example, the gas in chamber 36, exiting through port 58, conveniently circulates at a rate of approximately 10 cubic feet per minute for transporting the heat from wafer 14 to water tank 46.

Simultaneous with the establishment of the thermal gradient through wafer 14, droplets 24 are heated to a liquid state. With a high thermal gradient established through wafer 14, liquid aluminum droplets 24 migrate uniformally toward heating surface 42, as partially shown in FIG. 3. As droplets 24 migrate through wafer 14, they leave recrystallized connecting paths 22 which are of an opposite conductivity to wafer 14, as best shown in FIGS. 3, 6 and 7. For example, paths 22 are p-type silicon which contain traces of aluminum. Typically, each of the resultant internal connections 22 has a resistance of approximately 5 to 15 ohms.

In the preferred embodiment, a buffer layer 70 is applied to the entire area of bottom surface 20, interposing between bottom surface 20 and heating surface 42. Buffer layer 70 has the characteristic of being insoluble with liquid droplets 24. This enables buffer layer 70 to trap and terminate the migration of droplets 24, thereby preventing alloying or sticking of droplets 24 with heating surface 42. Buffer layer 70, thus, facilitates the subsequent removal of wafer 14 from heating surface 42. Buffer layer 70 comprises a material such as silicon dioxide or aluminum oxide. The process employing buffer layer 70 is described and claimed in the above-mentioned copending application by Kuen Chow and Jan Grinberg.

Buffer layer 70, which is silicon dioxide of conventional purity in the example, is applied to wafer bottom surface 20 by conventional techniques such as vapor deposition. Buffer layer 70, for example, is approximately one micrometer in thickness. After removal from heating surface 42, buffer layer 70 is removed by conventional resurfacing techniques such as grinding and polishing.

With the heat flowing through wafer 14 at approximately the typical temperature of 1000° C., a thermal gradient of 250° C./cm is established through wafer 14 in accordance with the invention. The resultant thermal gradient is approximately 2 to 5 times larger than the gradients disclosed in the prior art. The comparatively high thermal gradient allows the migration of droplets 24 to be completed in approximately 10 minutes. With wafers 14 being exposed to chamber heat for only such a comparatively short duration, more defect-free wafers are manufactured. Moreover, such a comparatively high thermal gradient enhances uniform migration of droplets 24, which in turn produces more wafers with completed migrations.

It will be apparent to those skilled in the art that various modifications may be made within the spirit of the invention and the scope of the appended claims. For example, the distance of gap 48, $d_G$, may be narrowed. Because the thermal gradient generally corresponds inversely to the distance of gap 48, a narrowing of distance $d_g$ to 2 mils increases the thermal gradient across wafer 14. This is due to the fact that water tank 46 is now closer to wafer 14 and is able to provide more heat removing capability. The narrowing of $d_G$ is accomplished by elevating drive shaft 62, which in turn elevates platform 40 and wafer 14 supported thereon. The narrowing of $d_G$ allows the process to proceed at either an even faster migration rate or a lower temperature. The lower temperature process permits migrations in a lower thermal gradient. Either selection results in even more defect-free wafers.

What is claimed is:

1. An apparatus for fabricating a semiconductor wafer by thermal gradient zone melting, said wafer body having generally parallel opposed top and bottom surfaces, said apparatus comprising:
    (a) a base;
    (b) a rotatable heating means mounted on said base, said heating means having a generally planar heating surface which is capable of supporting the entire area of the bottom surface of the semiconductor wafer, which aids in establishing a substantially uniform thermal temperature gradient through said wafer such that said bottom surface of said wafer is maintained at a higher temperature than said top surface;
    (c) a source of heat conductive gas;
    (d) heat sink means sufficiently spaced from the heating means but in close proximity therewith, such that a semiconductor wafer placed on said heating means forms a minimal space between said heating means and said heat sink means, said space capable of receiving a high heat conductive gas, such that said heat sink means and said gas cooperatively remove heat from within said wafer body through the top surface of said semiconductor wafer to enhance the establishment of a thermal temperature gradient; and
    (e) means for providing entry and exit of said heat conductive gas to and from said space.

2. The apparatus as claimed in claim 1 further comprising:
    an upper wall adapted to be removably mounted on said base, thereby defining an enclosed chamber containing said heating means, said heat sink means, and said gas space therein.

3. The apparatus as claimed in claim 2 further comprising:
    gas entry and exit ports connected to said chamber adapted to provide said gas to said chamber.

4. The apparatus as claimed in claim 1 or 2, wherein said heat sink means comprises a water tank having cooling water therein.

5. The apparatus as claimed in claim 1 or 2, wherein said heating platform is graphite.

6. The apparatus as claimed in claim 5, wherein said heating means comprises radio-frequency coils positioned adjacent said graphite platform for inducing heat-generating currents in said platform.

* * * * *